(12) United States Patent
Sinha et al.

(10) Patent No.: US 9,853,312 B2
(45) Date of Patent: Dec. 26, 2017

(54) METHOD FOR DETERMINING MEMBRANE PROTONIC RESISTANCE OF A FUEL CELL STACK

(71) Applicant: GM GLOBAL TECHNOLOGY OPERATIONS LLC, Detroit, MI (US)

(72) Inventors: Manish Sinha, Pittsford, NY (US); Derek R. Lebzelter, Conneaut, OH (US); John C. Fagley, Houston, TX (US); Megan J. Quick, Seattle, WA (US); Rodney J. Rhodes, Davisburg, MI (US); Sergio E. Garcia, Commerce Township, MI (US); Victor W. Logan, Naples, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 681 days.

(21) Appl. No.: 14/147,362

(22) Filed: Jan. 3, 2014

(65) Prior Publication Data
US 2014/0120434 A1 May 1, 2014

Related U.S. Application Data

(62) Division of application No. 12/696,745, filed on Jan. 29, 2010, now Pat. No. 8,647,783.

(51) Int. Cl.
*H01M 8/04* (2016.01)
*H01M 8/04537* (2016.01)
*G01R 31/36* (2006.01)

(52) U.S. Cl.
CPC .... *H01M 8/04634* (2013.01); *G01R 31/3662* (2013.01); *H01M 8/04* (2013.01)

(58) Field of Classification Search
CPC ......... H01M 8/04634; H01M 8/04641; H01M 8/04649
See application file for complete search history.

(56) References Cited

U.S. PATENT DOCUMENTS

| | | | |
|---|---|---|---|
| 2004/0234829 A1* | 11/2004 | Sederquist | H01M 8/0234 429/414 |
| 2007/0275275 A1* | 11/2007 | Scharf | H01M 8/04179 429/443 |
| 2009/0155634 A1* | 6/2009 | Thompson | H01M 8/04141 429/436 |
| 2010/0141262 A1* | 6/2010 | Watanabe | H01M 8/04358 324/430 |
| 2011/0014543 A1* | 1/2011 | Taniguchi | H01M 4/8605 429/483 |

FOREIGN PATENT DOCUMENTS

| | | | | |
|---|---|---|---|---|
| JP | WO 2007018294 A1 * | 2/2007 | ........ | H01M 8/04119 |
| JP | WO 2009119062 A1 * | 10/2009 | ......... | H01M 4/8605 |

\* cited by examiner

*Primary Examiner* — Stephan Essex
(74) *Attorney, Agent, or Firm* — John A. Miller; Miller IP Group, PLC

(57) ABSTRACT

A method for determining membrane humidification by determining the membrane protonic resistance of a fuel cell stack at humidified conditions, and normalizing the base resistance of the fuel cell stack against the base resistance of a reference fuel cell stack.

5 Claims, 3 Drawing Sheets

METHOD FOR DETERMINING MEMBRANE PROTONIC RESISTANCE OF A FUEL CELL STACK

CROSS-REFERENCE TO RELATED APPLICATIONS

This application is a divisional application of U.S. Utility application Ser. No. 12/696,745, titled Auto-Learning of Base Stack Resistance for HFR Based RH Control, filed Jan. 29, 2010.

BACKGROUND OF THE INVENTION

Field of the Invention

This invention relates generally to a method for determining the membrane protonic resistance of a fuel cell stack using high frequency resistance and, more particularly, to a method for determining the membrane protonic resistance of a fuel cell stack using high frequency resistance by determining how much of the total high frequency resistance is caused by various non-membrane resistances and then removing those resistances.

Discussion of the Related Art

Hydrogen is a very attractive fuel because it is clean and can be used to efficiently produce electricity in a fuel cell. A hydrogen fuel cell is an electro-chemical device that includes an anode and a cathode with an electrolyte therebetween. The anode receives hydrogen gas and the cathode receives oxygen or air. The hydrogen gas is dissociated at the anode catalyst to generate free protons and electrons. The protons pass through the electrolyte to the cathode. The protons react with the oxygen and the electrons at the cathode catalyst to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). Each MEA is usually sandwiched between two sheets of porous material, a gas diffusion layer (GDL) that protects the mechanical integrity of the membrane and helps in uniform reactant and humidity distribution. The part of the MEA that separates the anode and cathode flows is called the active area, and only in this area the water vapors can be freely exchanged between the anode and cathode. MEAs are relatively expensive to manufacture and require certain conditions for effective operation.

Several fuel cells are typically combined in a fuel cell stack to generate the desired power. For example, a typical fuel cell stack for a vehicle may have two hundred or more stacked fuel cells. The fuel cell stack receives a cathode input gas, typically a flow of air forced through the stack by a compressor. Not all of the oxygen is consumed by the stack and some of the air is output as a cathode exhaust gas that may include water as a stack by-product. The fuel cell stack also receives an anode hydrogen input gas that flows into the anode side of the stack.

A fuel cell stack includes a series of bipolar plates (separators) positioned between the several MEAs in the stack, where the bipolar plates and the MEAs are positioned between two end plates. The bipolar plates include anode side and cathode side flow distributors (flow fields) for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. One end plate includes anode gas flow channels and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

Fuel cell membranes are known to have a water-uptake which is necessary to provide proton conductivity. The water-uptake behavior of fuel cell membranes, however, causes an increase of volume of the membranes if conditions become more humid or wet and a decrease of volume if conditions become dryer. Changes in the volume of the cell membranes may cause mechanical stress on the membrane itself and the adjacent fuel cell components. In addition, a membrane that is too wet may cause problems during low temperature environments where freezing of the water in the fuel cell stack could produce ice that blocks flow channels and affects the restart of the system. Membranes that are too dry may have too low of an electrical conductivity at the next system restart that affects restart performance and may reduce stack durability.

It is known in the art to use a water vapor transfer (WVT) unit to capture some of the water in the cathode exhaust gas of a fuel cell stack, and use the water to humidify the cathode input airflow. It is also known in the art to use relative humidity (RH) sensors to monitor the humidification of the cathode input airflow. However, RH sensors can be costly and unreliable. Therefore, there is a need in the art to provide a method for maintaining an appropriate level of cell membrane humidification without relying on RH sensors.

High frequency resistance (HFR) is a well-known property of fuel cells, and is closely related to the ohmic resistance, or membrane protonic resistance, of fuel cell membranes. Ohmic resistance is itself a function of the degree of fuel cell membrane humidification. Therefore, by measuring the HFR of the fuel cell membranes of a fuel cell stack within a specific band of excitation current frequencies, the degree of humidification of the fuel cell membrane may be determined. This HFR measurement allows for an independent measurement of the fuel cell membrane humidification, thereby eliminating the need for RH sensors. However, variations in HFR measurements of the cell membranes can occur from stack to stack for various reasons, including HFR measurement errors (bias), variations in stack materials, or variations in stack design or compression. Furthermore, variations in HFR measurements can also occur due to degradation of stack components over the life of the fuel cell stack, such as delamination, which causes an increase in contact resistance. These variations in HFR measurements may be cumulatively referred to as non-membrane contact resistances. Non-membrane contact resistances are considered "noise" and may lead to inaccuracies in determining cell membrane humidification. Non-membrane contact resistance, may be quite large, e.g., 20 miliohms-cm$^2$.

Accordingly, there is a need in the art to calculate how much of the HFR measurement is caused by various non-membrane contact resistances to enable the control system of the fuel cell stack to remove the HFR that is caused by non-membrane contact resistances to determine how much of the total HFR measurement is caused by the protonic resistance of the fuel cell membrane, also known as the base fuel cell stack high frequency resistance.

SUMMARY OF THE INVENTION

In accordance with the teachings of the present invention, a method for determining membrane humidification by determining the membrane protonic resistance of a fuel cell stack using high frequency resistance-based relative humidity control in a fuel cell stack is disclosed. The method includes identifying the base resistance of the fuel cell stack at humidified conditions and normalizing the base resistance of the fuel cell stack against the base resistance of a reference fuel cell stack.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for determining base stack resistance for high frequency resistance-based relative humidity control is merely exemplary in nature, and is in no way intended to limit the invention or its applications or uses.

Figure 1:
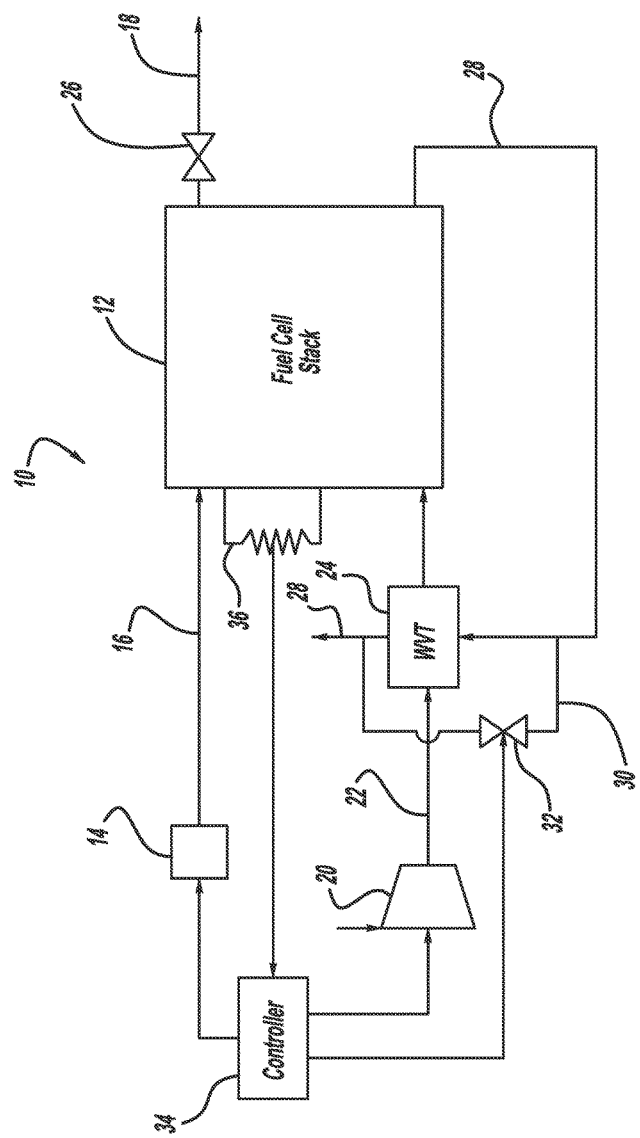
FIG. 1 is a schematic block diagram of a fuel cell system.

FIG. 1 is a schematic block diagram of a fuel cell system 10 including a fuel cell stack 12. The fuel cell stack 12 receives hydrogen from a hydrogen source 14 on anode input line 16 and provides an anode exhaust gas on line 18. A bleed valve 26 is provided in the anode exhaust gas line 18 to allow anode exhaust gas to be exhausted as desired. A compressor 20 provides an airflow to the cathode side of the fuel cell stack 12 on cathode input line 22 through a water vapor transfer (WVT) unit 24 that humidifies the cathode input air. A cathode exhaust gas is output from the stack 12 on a cathode exhaust gas line 28. The exhaust gas line 28 directs the cathode exhaust to the WVT unit 24 to provide the humidity to humidify the cathode input air. A by-pass line 30 is provided around the WVT unit 24 to allow the cathode exhaust gas to by-pass the WVT unit 24. A by-pass valve 32 is provided in the by-pass line 30 and is controlled to selectively redirect the cathode exhaust gas through or around the WVT unit 24 to provide the desired amount of humidity to the cathode input air.

An HFR sensor 36 measures the high frequency resistance (HFR) of the fuel cell stack 12 to determine the cell membrane humidification of the fuel cell stack 12. The HFR sensor 36 operates by measuring the ohmic resistance, or membrane protonic resistance, of the fuel cell stack 12. Membrane protonic resistance is a function of membrane humidification of the fuel cell stack 12, however, stack-to-stack variation in the HFR sensor measurements may be caused by differences in design parameters, such as compression and variability of parts, degradation of fuel cell stack components over the life of the stack 12, and measurement errors from the HFR sensor 36 itself. Therefore, HFR-based membrane humidification control systems must be able to adapt to these variations to ensure that the level of humidification of the fuel cell membrane is maintained at an appropriate level for the life of the fuel cell stack 12.

The system 10 also includes a controller 34 that receives HFR measurement signals from the sensor 36 and controls the speed of the compressor 20, the injection of hydrogen from the hydrogen source 14, and the position of the by-pass valve 32 and the bleed valve 26.

Variation in parts in the balance of plant (i.e., rest of plant) may also impact fuel cell stack humidification. For example, suppose one vehicle includes an inefficient WVT unit and a fuel cell stack with a low HFR sensor reading. This fuel cell stack will be running dryer than desired and the HFR sensor will not detect it. Alternatively, suppose another vehicle has a WVT unit with high efficiency and a fuel cell stack with a high HFR sensor reading. This fuel cell stack will be running wetter than desired and the HFR sensor will not detect it. In addition, the rest of plant items, such as valves, thermocouples, heat exchangers, pressure and delta-P transducers, etc., could also cause variations in HFR sensor measurements.

Figure 2:
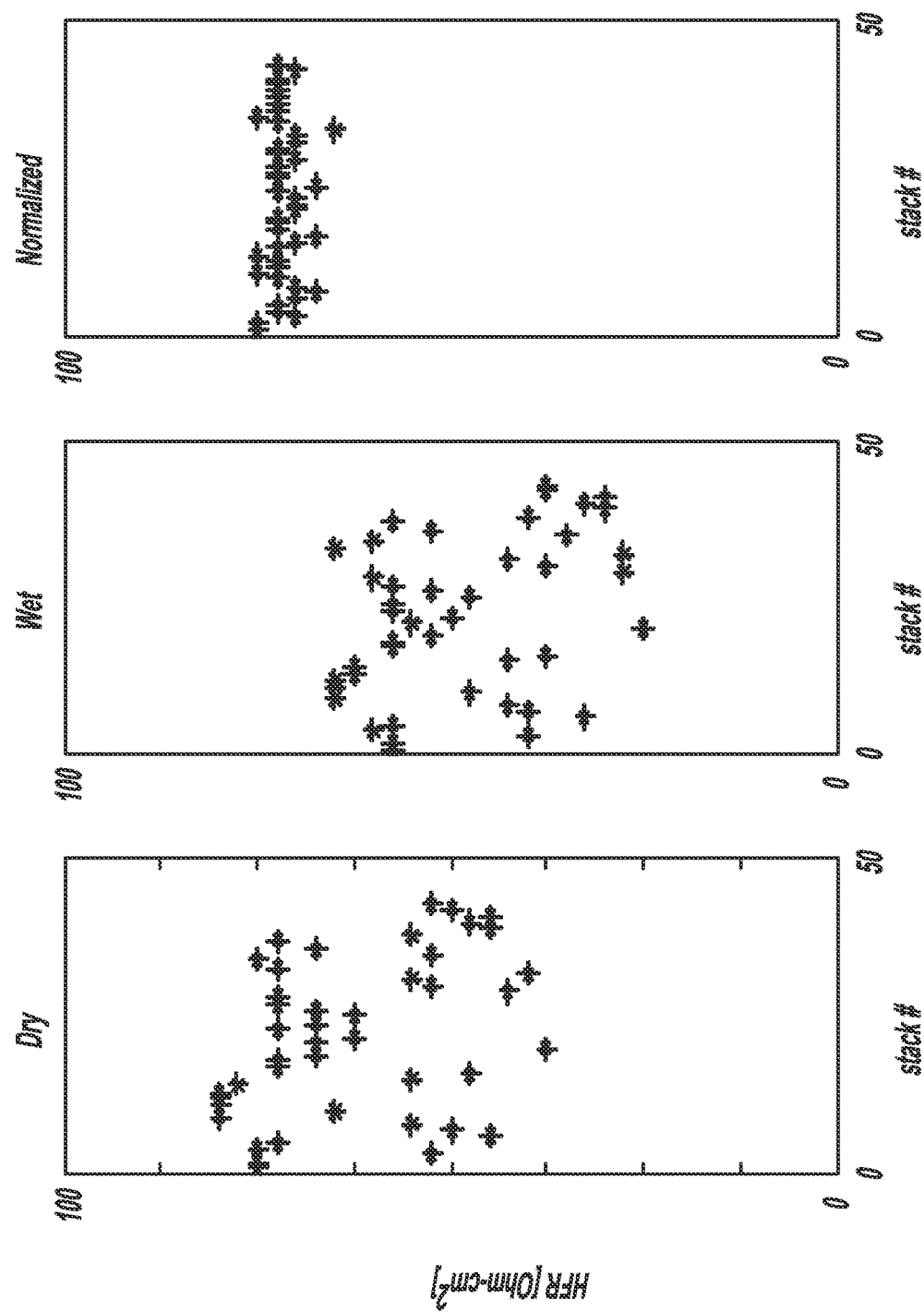
FIGS. 2a-2c are plot diagrams of the HFR of fifty fuel cell stacks operated under dry conditions, wet conditions, and normalized, respectively.
Figure 3:
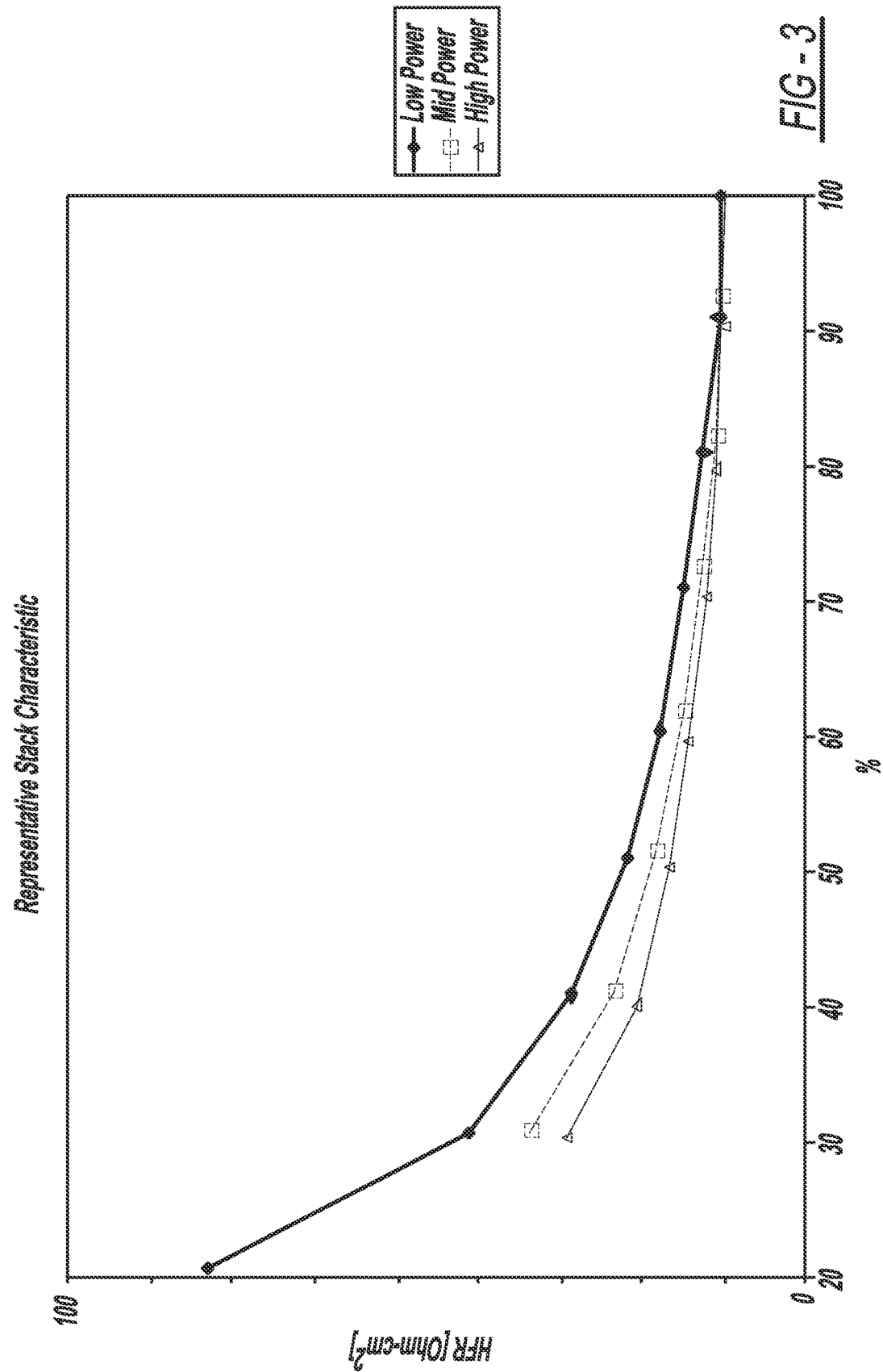
FIG. 3 is a graph with relative humidity on the x-axis and HFR on the y-axis illustrating the relationship between HFR and relative humidity at three different stack current densities.

FIGS. 2a-2c are plot diagrams of the HFR measurements of fifty fuel cell stacks operated under dry conditions, wet conditions, and normalized, respectively. FIGS. 2a-2c illustrate that variation tightens when the actual HFR is normalized with respect to stack HFR measurement under wet conditions. When operated under dry conditions and wet conditions, the stacks exhibit a variation in HFR measurements that may be quite large, as is illustrated in FIGS. 2a and 2b. FIG. 3 is a graph with RH on the x-axis and HFR on the y-axis that illustrates that as the level of cell membrane humidification approaches 100%, the HFR measurement of the cell membrane will converge to a known value, regardless of the variation in the HFR sensor measurements that may occur at lower RH values. Thus, for example, the variation in HFR of the stacks of FIG. 2 operated under dry conditions will be eliminated as the stacks converge to a known value upon cell membrane saturation. Thus, HFR "noise" is eliminated when the fuel cell stacks reach an RH value equal to or greater than 100%. This convergence to a known value upon membrane saturation is illustrated in the normalized plot diagram of FIG. 2. Accordingly, membrane protonic resistance can be illustrated using the following equation:

$$HFR = HFR^{base} + f(RH) \quad (1)$$

Where $HFR^{base}$ is fuel cell membrane base stack resistance and f (RH) is resistance rise of the fuel cell membrane as a function of relative humidity.

Going back to FIG. 2, the fuel cell stacks in the normalized plot diagram illustrate that once HFR "noise" is determined and subtracted for each fuel cell stack, which is described in detail below, the remaining membrane resistance for each of the fuel cell stacks is similar, e.g., around 90 miliohm-cm$^2$. Thus, by removing HFR "noise" due to various contact resistances and other non-membrane resistances, fuel cell membrane humidification for each fuel cell stack can be calculated with a reasonable degree of accuracy. How the HFR "noise" is determined and filtered out is set forth in detail below.

One way to address stack-to-stack HFR measurement variation due to HFR "noise" is to identify each fuel cell stack's membrane protonic resistance by determining base resistance (j) at humidified conditions ($HFR_j^{wet}$) and normalize it against the HFR measurement of some reference fuel cell stack, such as a fuel cell stack which is known to have accurate compression, and thus no appreciable contact resistance (i.e., a stack without "noise"). To identify base stack resistance at humidified conditions, the following options are available: (1) ensure the fuel cell stack comes with base stack resistance at humidified conditions identified during handover to module, i.e., prior to insertion in a vehicle, (2) identify base stack resistance at humidified conditions by running the stack wet and having the controller 34 auto-learn this prior to inserting the fuel cell stack in a vehicle (e.g., in certain situations, modules go through a "break-in" hydration step, thus auto-learning may be combined in this step with the value being stored in the memory of the controller 34), or (3) allow base stack resistance at humidified conditions to be learned by the controller 34 after the fuel cell stack 12 has been place in a vehicle, and determined during a cold and wet start-up. Additionally, if contact resistance changes appreciably over the life of the fuel cell stack 12, it may be necessary to determine base stack resistance at humidified conditions periodically while in a vehicle during a cold and wet start.

Once it is determined that the fuel cell stack's base resistance at humidified conditions needs to be determined, which may occur periodically throughout the life of the fuel cell stack 12, the first step is for the controller 34 to determine the temperature of the fuel cell stack 12 at key on to ensure that the stack 12 is not warm, as saturation of the stack membranes is part of the auto-learning process and is more readily achieved utilizing a cold and wet start. Calibration and implementation may dictate having a trigger based on ambient temperature and thus no active diagnostics. It will be readily apparent to those skilled in the art that various methods for determining that the temperature is suitable to implement the determination of the base resistance of the fuel cell stack at humidified conditions are available without departing from the scope of the present invention.

Once the controller 34 determines that the fuel cell stack 12 is cold at key on, the level of relative humidity exhausted from the fuel cell stack 12 on the cathode exhaust line 28 is set to greater than or equal to 100%. The base stoichiometry set-point is also increased, where base stoichiometry may be twice as high as nominal stoichiometry, or more if at low stack power. Inlet RH on the cathode air input line 22 is set to approximately 80% to fully utilize the WVT unit 24. Increasing the stoichiometry lowers the temperature set-point to achieve high cell membrane humidification of the fuel cell stack 12 and also reduces the chance of flooding in the anode and cathode flow channels of the fuel cell stack 12. Determination of the hydration state of the membrane electrode assembly is discussed in detail below.

Once the cathode inlet RH on the cathode air input line 22 and the outlet RH on the cathode exhaust line 28 are set to the desired values, intermittent bleeds of the fuel cell stack 12 occur, preferably by bleeding to emissions, to maximize bleed velocity to improve anode water management. The increased stoichiometry operates to lower the temperature set-point, as discussed above, and fully opening any radiator by-pass valve will provide maximum cooling. The length of time the fuel cell stack 12 is kept at an outlet RH greater than or equal to 100% will depend on the cooling capacity of the fuel cell system 10. Hence, auto-learning of the base resistance of the fuel cell stack 12 may be more effective in cold conditions rather than warm, as saturation is more readily achieved when the fuel cell stack 12 is cold.

A water buffer model in the controller 34 integrates the product water and estimates the fuel cell membrane electrode assembly (MEA) and diffusion media hydration state of the stack 12. When the model estimates that the MEA is close to saturation, which is a calibratable estimation, the auto-learning operation of the controller 34 is triggered. During auto-learning, the HFR of the fuel cell stack 12 is measured by the controller 34 using the HFR sensor 36 for a period of time, such as for a few seconds. This data is filtered as $HFR_j^{wet}$ and is then saved in a non-volatile memory of the controller 34. During subsequent operation, until the next $HFR_j^{wet}$ update, the HFR sensor 36 measurements are normalized by the controller 34 by comparing the measurement of $HFR_j^{wet}$, to the HFR measurement of a reference fuel cell stack's base resistance at humidified conditions, and using the following equation:

$$HFR_j^{norm}(t) = HFR_j^{raw}(t) - HFR_j^{wet} + HFR_{ref}^{wet} \quad (2)$$

Where $HFR_j^{norm}(t)$ is HFR normalized, $HFR_j^{raw}(t)$ is measured HFR including "noise", $HFR_j^{wet}$ is the HFR after the membrane of the fuel cell stack 12 has been fully saturated (i.e., HFR is a measure of membrane protonic resistance), and $HFR_{ref}^{wet}$ is the HFR of the reference stack operating with a fully saturated membrane. Thus, the key to HFR based RH control using the controller 34 is not to feedback on the absolute value of HFR, but the HFR measurement in reference to a base HFR of the fuel cell stack during a humidified state, which is then compared to the HFR of a reference stack base HFR during a humidified state.

A reconditioning mode of the fuel cell stack 12 could be used to generate the wet conditions necessary for auto-learning of the controller 34 to take place, and thus would replace the steps leading up to the auto-learning of the controller 34 described above, as the fuel cell stack membranes are fully saturated during the reconditioning mode. In addition, employing this strategy periodically during the life of the fuel cell stack 12 may enable the controller 34 to detect and filter out changing RH versus HFR over the life of the fuel cell stack 12, or changing operation of the rest of plant over time, for example, water vapor transfer efficiency, bypass valve operation, etc.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining a normalized high frequency resistance of a fuel cell stack, said method comprising:
   starting up operation of the fuel cell stack;
   adjusting a cathode air compressor and a water vapor transfer (WVT) unit to increase cell membrane humidification, where the compressor and the WVT unit are adjusted by a controller including a processor and a memory;
   using a water buffer model, calculated in the controller, to estimate a membrane hydration state of the fuel cell stack at humidified conditions, where the water buffer model integrates product water output by the fuel cell stack;

measuring a high frequency resistance of the fuel cell stack using a high frequency resistance (HFR) sensor electrically coupled to the fuel cell stack;

identifying, using the controller, a base high frequency resistance of the fuel cell stack at humidified conditions from the high frequency resistance measured by the HFR sensor, including filtering and using data gathered for the base fuel cell stack high frequency resistance at humidified conditions once the water buffer model estimates that the membrane hydration state of the fuel cell stack is within 10% of saturation; and normalizing the base high frequency resistance of the fuel cell stack against a base high frequency resistance of a reference fuel cell stack to determine the normalized high frequency resistance of the fuel cell stack: and adjusting the cathode air compressor and the WVT unit, by the controller, to achieve a desired cell membrane humidification based on an estimated relative humidity calculated from the normalized high frequency resistance.

2. The method according to claim 1 further comprising intermittently bleeding the fuel cell stack to improve water management in the fuel cell stack.

3. The method according to claim 1 further comprising increasing a base stoichiometry of the fuel cell stack to higher than a nominal stoichiometry before identifying the base high frequency resistance of the fuel cell stack at humidified conditions so as to lower the temperature to achieve a high relative humidity and reduce the chance of flooding in anode and cathode flow channels of the fuel cell stack.

4. The method according to claim 3 wherein increasing a base stoichiometry of the fuel cell stack to higher than a nominal stoichiometry includes increasing the base stoichiometry of the fuel cell stack to twice as high as the nominal stoichiometry.

5. The method according of claim 1 wherein adjusting a cathode air compressor and a water vapor transfer (WVT) unit to increase cell membrane humidification includes increasing a relative humidity of cathode air entering the fuel cell stack to 80% relative humidity.

* * * * *